United States Patent [19]

Seki et al.

[11] Patent Number: 5,409,569
[45] Date of Patent: Apr. 25, 1995

[54] ETCHANT, DETERGENT AND DEVICE/APPARATUS MANUFACTURING METHOD

[75] Inventors: Hitoshi Seki, Sendai; Satoshi Miyazawa, Miyagi; Tadahiro Ohmi, Sendai; Kazuko Ogino, Sendai; Akira Abe, Sendai; Tsutomu Nakamura, Sendai; Hirofumi Fukui, Miyagi; Yasuhiko Kasama, Sendai, all of Japan

[73] Assignee: Alps Electric Co., Ltd., Tokyo, Japan

[21] Appl. No.: 128,419

[22] Filed: Sep. 28, 1993

[30] Foreign Application Priority Data

Sep. 30, 1992 [JP] Japan .................. 4-285338

[51] Int. Cl.⁶ .............................. B05D 5/00
[52] U.S. Cl. .................. 156/662; 252/79.3; 134/3
[58] Field of Search ........... 252/79.1, 79.2, 79.3; 156/662; 134/2, 3

[56] References Cited

U.S. PATENT DOCUMENTS

| H. 291 | 6/1987 | Boos | 156/643 X |
| 4,369,099 | 1/1983 | Kohl et al. | 204/129.3 |
| 4,578,419 | 3/1986 | Hall | 427/435 X |
| 4,734,387 | 3/1988 | Nelson et al. | 437/234 |
| 5,111,259 | 5/1992 | Teng et al. | 437/228 X |

FOREIGN PATENT DOCUMENTS 52-99101  8/1977  Japan.
57-137472 8/1982  Japan.

OTHER PUBLICATIONS

"Chemical etching for the evaluation of hydrogenated amorphous silicon films," T. L. Chu and Shirley S. Chu, Appl. Phys. Lett. 48(26), 30 Jun. 1986 pp. 1783–1784.

*Primary Examiner*—Thi Dang
*Attorney, Agent, or Firm*—Guy W. Shoup; Patrick T. Bever

[57] ABSTRACT

An etchant which generates neither heat nor gas during the process, does not sublimate, is stable for a long period of time, requires no special pipings, and further requires no special treatment of waste water because of containing no organic solvents. The etchant is a solution containing hydrofluoric acid and an-oxoacid or oxoacid salt compound expressed by $M_m(XO_n)_p$ (where M is hydrogen, one-to three-valence metal or $NH_4$, m is 1 or 5, X is a halogen element, n is 3, 4 or 6, and p is 1, 2 or 3).

4 Claims, 4 Drawing Sheets

PERIOD OF PRESERVATION BEING OPEN TO AIR (HOUR)

ETCHANT, DETERGENT AND DEVICE/APPARATUS MANUFACTURING METHOD

BACKGROUND OF THE INVENTION

1. Field of the Invention

The present invention relates to an etchant suitable for wet-etching the solid surface, a method of etching constituent members of a device by using the etchant to manufacture the device, particularly, a method of manufacturing a device whose constituent members are made of silicon, a detergent suitable for cleaning the solid surface, and a method of cleaning constituent members of an apparatus by using the detergent and manufacturing the apparatus.

2. Description of the Prior Art

Hitherto, a mixed solution of hydrofluoric acid, nitric acid and acetic acid has been employed as an etchant or detergent. Such a mixed solution is widely used, in particular, in the process of etching single crystal silicon (hereinafter referred to as c-Si), polycrystal silicon (hereinafter referred to as p-Si), amorphous silicon (hereinafter referred to as a-Si) or the like which are used with manufacture of devices represented by electronic devices such as semiconductor devices, in the process of cleaning the surfaces of constituent members of an apparatus, such as plate members and stainless pipes, during manufacture of the apparatus, as well as in the process of cleaning appliances for us with the above process.

In those processes of using the conventional etchant or detergent to etch the surfaces of constituent members of an electronic device or the like during manufacture thereof, to clean the surfaces of constituent members of an apparatus, such as plate members and stainless pipes, during manufacture of the apparatus, and to clean appliances for use with the above process, however, nitric acid decomposes during the process and a toxic nitrogen oxide (NOx) generates. A special treatment apparatus has, therefore, been essential to prevent the generated toxic gas from giving a detrimental effect on environments.

A reaction occurred when using the conventional etchant on the surface of silicon which is a member constituting semiconductor devices as representative devices, is expressed as follows. It is seen from the reaction formula that a toxic nitrogen oxide (NO) generates.

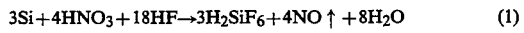

$$3Si + 4HNO_3 + 18HF \rightarrow 3H_2SiF_6 + 4NO \uparrow + 8H_2O \qquad (1)$$

Another problem was in that because gas generates during the process, the conventional etchant could not be applied to forming of fine patterns when semiconductor devices are manufactured through etching.

Also, in the process using a solution containing nitric acid, there usually accompanies strong heating, thus making it quite difficult to precisely control temperature at the reaction surface . s point not only has disabled application of the conventional etchant to fine etching, but also has required equipment sufficiently considered from the standpoint of ensuring safety in the processes of using the conventional etchant or detergent to etch the surfaces of constituent members of an electronic device during manufacture thereof, to clean the surfaces of constituent members of an apparatus, such as plate members and stainless pipes, during manufacture of the apparatus, and to clean appliances for use with the above process.

Because nitric acid has a property to penetrate tubes made of perfluoroalkoxy fluoride-contained polymers (PFA) which are popularly used with chemicals piping systems, it is required to employ special tubes of double- or triple-walled structure. This has been a great impediment from the viewpoint of operating control for a production factory due to the increased cost of pipings and the necessity of checking a liquid leakage at all times.

Furthermore, acetic acid used in the aforesaid mixed solution for the purpose of preventing release of nitric acid is an organic acid. Special drain treatment has thus been needed when the mixed solution is discarded, so that a COD value of the waste water is held within a predetermined level.

In the manufacture process of semiconductor devices using the conventional etchant, a sufficient etching speed could not be obtained unless concentrations of hydrofluoric acid and nitric acid used were high. For example, in order to achieve an etch rate of 1,500 angstroms per minute as an etching speed of a-Si at room temperature during manufacture of semiconductor devices, concentrations of hydrofluoric acid and nitric acid had to be set to 0.52 mol/l and 6.4 mol/l, respectively. The use of the conventional etchant which contains nitric acid of such a high concentration caused degeneration of a photoresist and, as shown in FIG. 2, deterioration in adhesion between a photoresist 3 and silicon 2 to be treated. Consequently, also as shown in FIG. 2, the amount of side etching was so increased that fine patterns could not be achieved.

Moreover, the conventional etchant used in the manufacture process of semiconductor devices contains acetic acid as one ingredient, as mentioned above. As shown in FIG. 3, however, acetic acid acts to damage the photoresist 3 such that photoresist dissolved portions 4 are produced to change the photoresist 3 into a porous film. This also has impeded the conventional etchant from being applied to forming of fine patterns.

Additionally, Japanese Patent Laid-Open No. 137472 discloses the so-called iodine etchant in which iodine is added to the conventional mixed solution of hydrofluoric acid, nitric acid and acetic acid, aiming to increase an etch rate. But this iodine etchant still requires nitric acid of a high concentration. In order to achieve the aforesaid etch rate of a-Si at room temperature, concentrations of hydrofluoric acid and nitric acid has to be set to 0.52 mol/l and 1.6 mol/l, respectively, even with iodine of 0.015 mol/l added. Thus, the problems attributable to nitric acid of a high concentration have not yet solved. Further, as shown in FIG. 4, iodine is tends to sublimate and easily escape out of the system if it is open to air. Therefore, stability of the etchant is poor to such an extent that the etch rate is lowered down 25% in 10 hours, resulting in a severe problem from the standpoint of operating control.

SUMMARY OF THE INVENTION

An object of the present invention is to provide an etchant, a device manufacturing method of using the etchant, a detergent, and an apparatus manufacturing method of using the detergent, which can solve the above-mentioned problems in the prior art.

An etchant of the present invention contains, in a solution, hydrofluoric acid and an oxoacid or oxoacid salt compound expressed by Mm(XOn)p (where M is hydrogen, one- to three-valence metal or NH$_4$, m is 1 or 5, X is a halogen element, n is 3, 4 or 6, and p is 1, 2 or 3). Examples of the oxoacid or oxoacid salt compound which act effectively when used in the present invention include bromic acid (HBrO$_3$), lithium bromate (LiBrO$_3$), potassium bromate (KBrO$_3$), sodium bromate (NaBrO$_3$), ammonium bromate (NH$_4$BrO$_3$), calcium bromate (Ca(BrO$_3$)$_2$), magnesium bromate (Mg(BrO$_3$)$_2$), zinc bromate (Zn(BrO$_3$)$_2$), copper bromate (Cu(BrO$_3$)$_2$), aluminum bromate (Al(BrO$_3$)$_2$), perbromic acid (HBrO$_4$), lithium perbromate (LiBrO$_4$), potassium perbromate (KBrO$_4$), iodic acid (HIO$_3$), lithium iodate (LiIO$_3$), potassium iodate (KIO$_3$), sodium iodate (NaIO$_3$), ammonium iodate (NH$_4$IO$_3$), calcium iodate (Ca(IO$_3$)$_2$), magnesium iodate (Mg(IO$_3$)$_2$), zinc iodate (Zn(IO$_3$)$_2$), ferrous iodate (Fe(IO$_3$)$_2$), copper iodate (Cu(IO$_3$)$_2$), aluminum iodate (Al(IO$_3$)$_2$), ferric iodate (Fe(IO$_3$)$_3$), periodic acid (HIO$_4$, H$_5$IO$_6$), lithium periodate (LiIO$_4$), potassium periodate (KIO$_4$), zinc periodate (Zn$_5$(IO$_6$)$_2$), potassium chlorate (KClO$_3$), and the like. Among these compounds, iodic acid (HIO$_3$), potassium iodate (KIO$_3$) and potassium bromate (KBrO$_3$) are suitable because the reagents are easy to handle. Above all, iodic acid (HIO$_3$) is optimum as an etchant for semiconductor devices which are representative of electronic devices, because it contains no metal elements which possibly become a source contaminating those semiconductor devices.

In accordance with a second embodiment of the present invention, a device manufacturing method is provided wherein a process of etching members which constitute a device is performed by using the aforesaid etchant.

In accordance with a second aspect of the second embodiment the device manufacturing method is further characterized in that the members which constitute the device are particularly made of silicon.

In accordance with a third embodiment and detergent of the present invention contains, in a solution, hydrofluoric acid and an oxoacid or oxoaacid salt compound expressed by Mm(XOn)p (where M is hydrogen, one- to three-valence metal or NH$_4$, m is 1 or 5, X is a halogen element, n is 3, 4 or 6, and p is 1, 2 or 3).

Examples of the oxoacid or oxoacid salt compound which act effectively when used in the detergent of the present invention are the same as the reagents which are effective as the etchant of the present invention. Also, similarly to the case of the etchant, iodic acid is optimum as a detergent for cleaning constituent members of an apparatus.

In accordance with a fourth embodiment of the present invention apparatus manufacturing method is provided wherein a process of cleaning members which constitute an apparatus is performed by using the aforesaid detergent.

With the etchant prepared according to the present invention, the oxoacid or oxoacid salt compound, including iodic acid, serves as a strong oxidizer to change the solid surface into an oxide. The oxide is then dissolved by the hydrofluoric acid. Therefore, the present etchant acts effectively in a process of removing the solid surface.

During the process, there occurs neither heating nor generation of gas as a secondary product. Because the oxoacid or oxoacid salt compound does not sublimate, the present etchant is stable for a long period of time.

Also, the present etchant has no property to penetrate ordinary tubes made of perfluoroalkoxy fluoride-contained polymers (PFA). Furthermore, the present etchant contains no organic solvent, with the result that a COD value of the drain will not be increased. Additionally, because of not affecting any photoresist, the present etchant neither deteriorates adhesion between the photoresist and the member to be etched, nor damages the photoresist itself.

By using the etchant of the present invention, the above-explained advantageous actions are provided during the process and, as a result, devices can be stably manufactured with inexpensive equipment.

The etchant of the present invention functions effectively as follows, in particular, during manufacture of a device formed of silicon. Such a device can be stably manufactured with inexpensive equipment by using the etchant of the present invention.

When the surface of silicon as semiconductor material of semiconductor devices, which are representative of electronic devices, is etched by using the present etchant containing iodic acid as the oxoacid, the resulting reaction is expressed by the following formula:

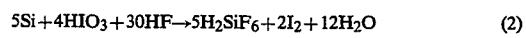

$$5Si + 4HIO_3 + 30HF \rightarrow 5H_2SiF_6 + 2I_2 + 12H_2O \qquad (2)$$

During this reaction, no gas generates as a secondary product. Iodine is produced, but it can be easily removed out of the system. Because the oxoacid or oxoacid salt compound, represented by iodic acid, does not sublimate, the present etchant is stable for a long period of time.

With the detergent prepared according to the present invention, the oxoacid or oxoacid salt compound, including iodic acid, serves as a strong oxidizer to change a contaminant formed on the solid surface into an oxide. The oxide is then dissolved by the hydrofluoric acid. Therefore, the present detergent acts effectively in a process of cleaning the solid surface.

During the process, similarly to the etchant of the present invention, there occurs neither heating nor generation of gas as a secondary product. Because the oxoacid or oxoacid salt compound does not sublimate, the present detergent is stable for a long period of time.

Also, the present detergent has no property to penetrate ordinary tubes made of perfluoroalkoxy fluoride-contained polymers (PFA). Furthermore, the present detergent contains no organic solvent, with the result that a COD value of the drain will not be increased.

The reaction formula between a contaminant on the surface and iodic acid used as oxoacid is expressed by replacing the Si element in the above formula (2) with an element corresponding to the contaminant.

By using the detergent of the present invention in manufacture of a device, the stable cleaning process can be performed at a constant cleaning speed for a long period of time, similarly to the manufacture method using the etchant of the present invention, with neither heating and generation of any toxic gas due to the present detergent, nor variations in composition of the effective components.

DETAILED DESCRIPTION OF THE PREFERRED EMBODIMENT

Hereinafter, the present invention will be described with reference to Examples embodying the invention.

(EXAMPLE 1)

An etchant was prepared adding hydrofluoric acid (EL grade made by Daikin Kogyo Co., Ltd.) and iodic acid ($HIO_3$) (special grade made by Wako Junyaku Co., Ltd.) to pure water in a Teflon container such that the hydrofluoric acid and the iodic acid had concentrations of 0.52 mol/l and 0.04 mol/l , respectively.

A substrate formed on its surface with an a-Si film by the plasma CVD film forming method was dipped in the etchant. As a result of measuring an etch rate at room temperature, the a-Si film was etched at a rate of 2000 angstroms per minute. It was thus confirmed that the prepared etchant was excellent one. During the surface treatment, neither heating nor generation of gas were found, and a color change of the solution due to iodine was only found. It was thus also confirmed that no special processing apparatus for protection of environments was necessary to carry out the etching process, and that the above reaction formula (2) was truly developed.

As a result of measuring a COD value of the etchant, the value was below a measurable limit as expected from the above reaction formula (2). It was thus confirmed that no special treatment of the waste water for preventing an increase in the COD value of the drain was necessary before discarding the etchant.

The etchant was circulated for six months under a feed pressure of 1 kg/cm² through a piping system comprised of pipes having an inner diameter of 10 mm and made of perfluoroalkoxy fluoride-contained polymers (PFA) through which nitric acid penetrates. But any abnormality such as permeation of components of the etchant or discoloration of the tubes was not found.

Figure 1:
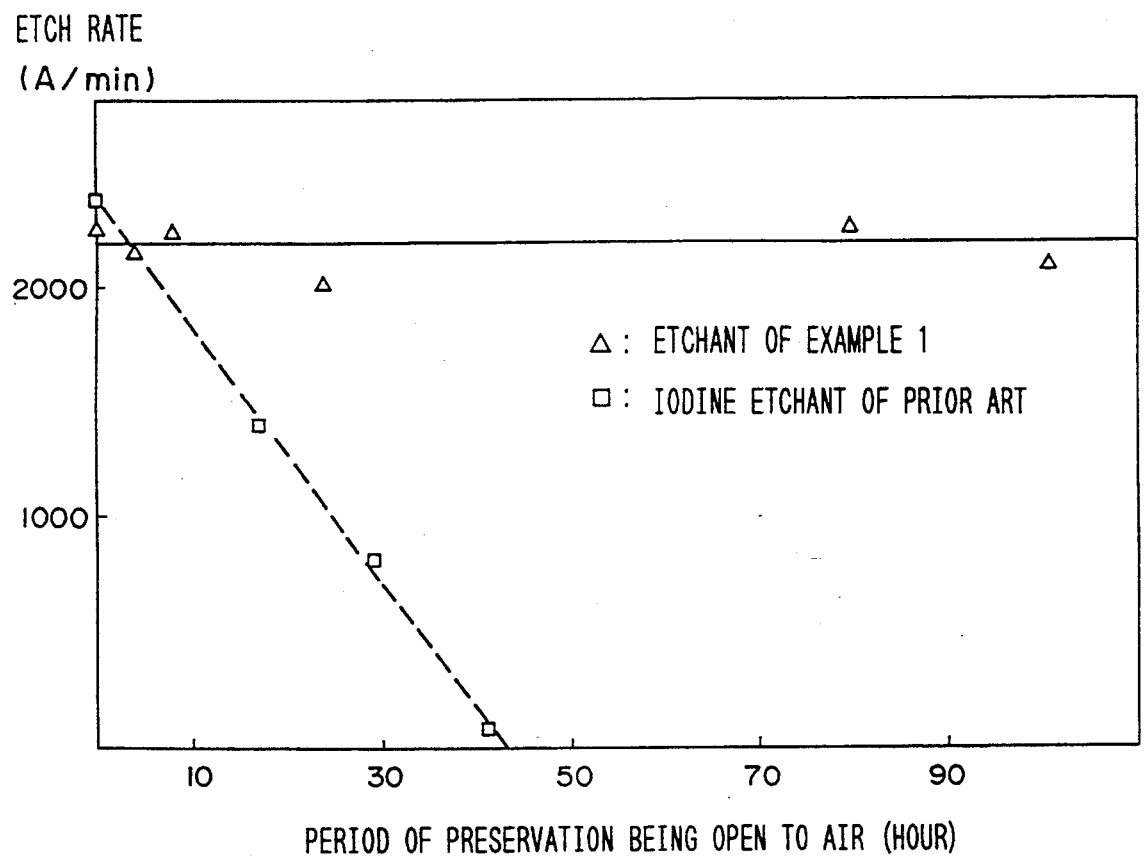
FIG. 1 is a graph showing time-dependent changes of etch rates in Example 1 and the prior art.
Figure 2:
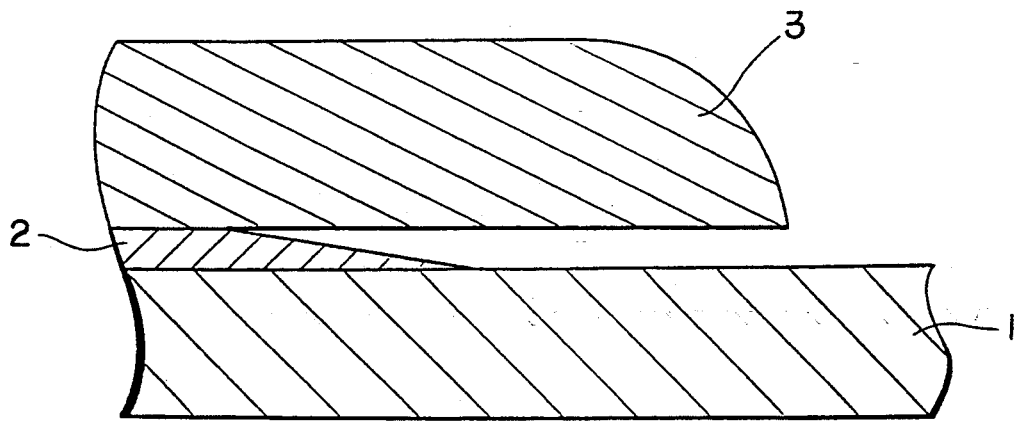
FIG. 2 is a schematic cross-sectional view showing side etching in the prior art.
Figure 3:
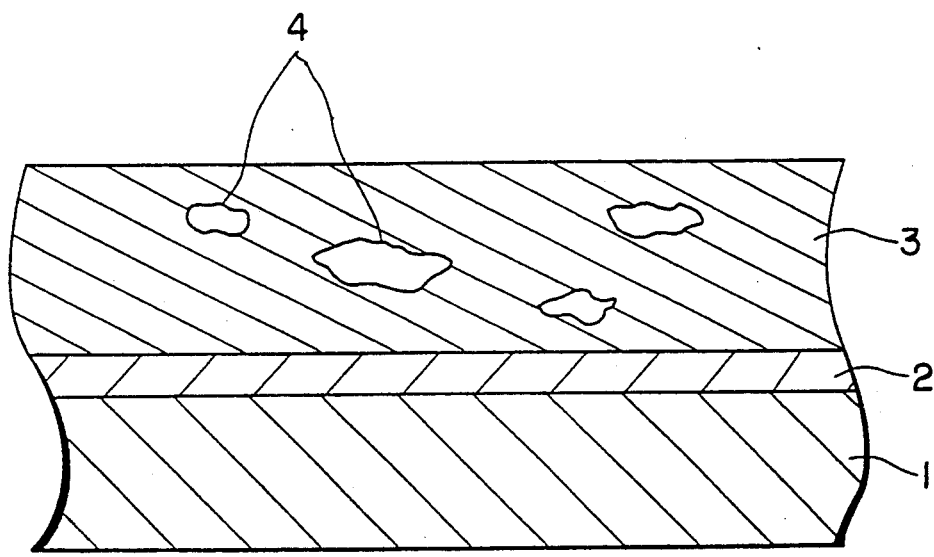
FIG. 3 is a schematic cross-sectional view showing damages of a photoresist in the prior art.
Figure 4:
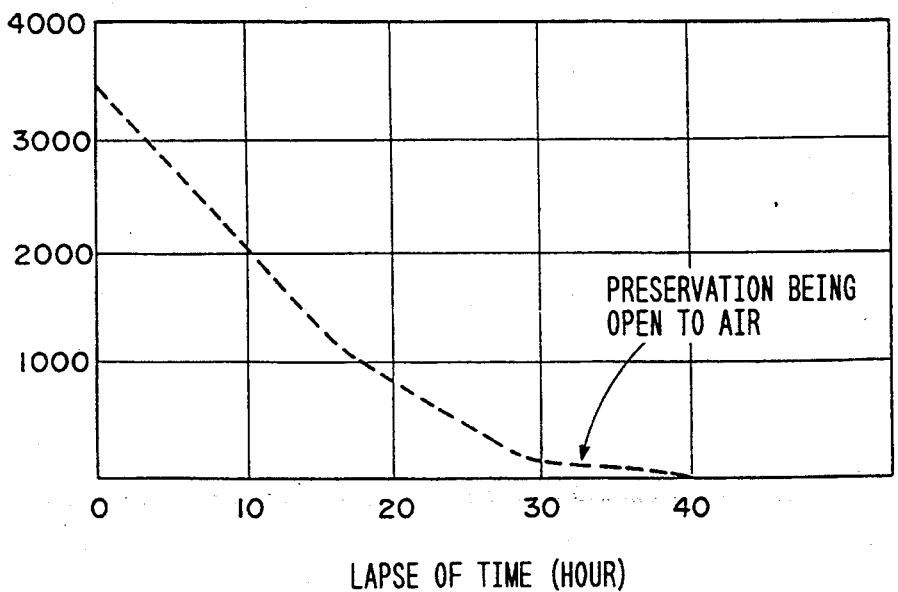
FIG. 4 is a graph showing time-dependent changes of an iodine concentration of in the prior art etchant containing iodine.

FIG. 1 shows changes in an etch rate of the etchant when preserved while being open to air. In FIG. 1, the vertical axis represents an etch rate (angstroms / minute) of a-Si at room temperature, and the horizontal axis repre- sents a period of preservation being open to air (hour). Marks Δ in FIG. 1 indicate results of the etchant prepared according to this Example 1, and marks ☐ indicate results of the prior art iodine etchant added with iodine and having the composition stated before as an example of the prior art.

The etch rate of the prior art iodine etchant was lowered about 25% after preservation for 10 hours, as explained before in "Description of the Prior Art". In contrast, the etch rate of the etchant of the present invention was not appreciably lowered even after preservation for 100 hours.

Figure 5:
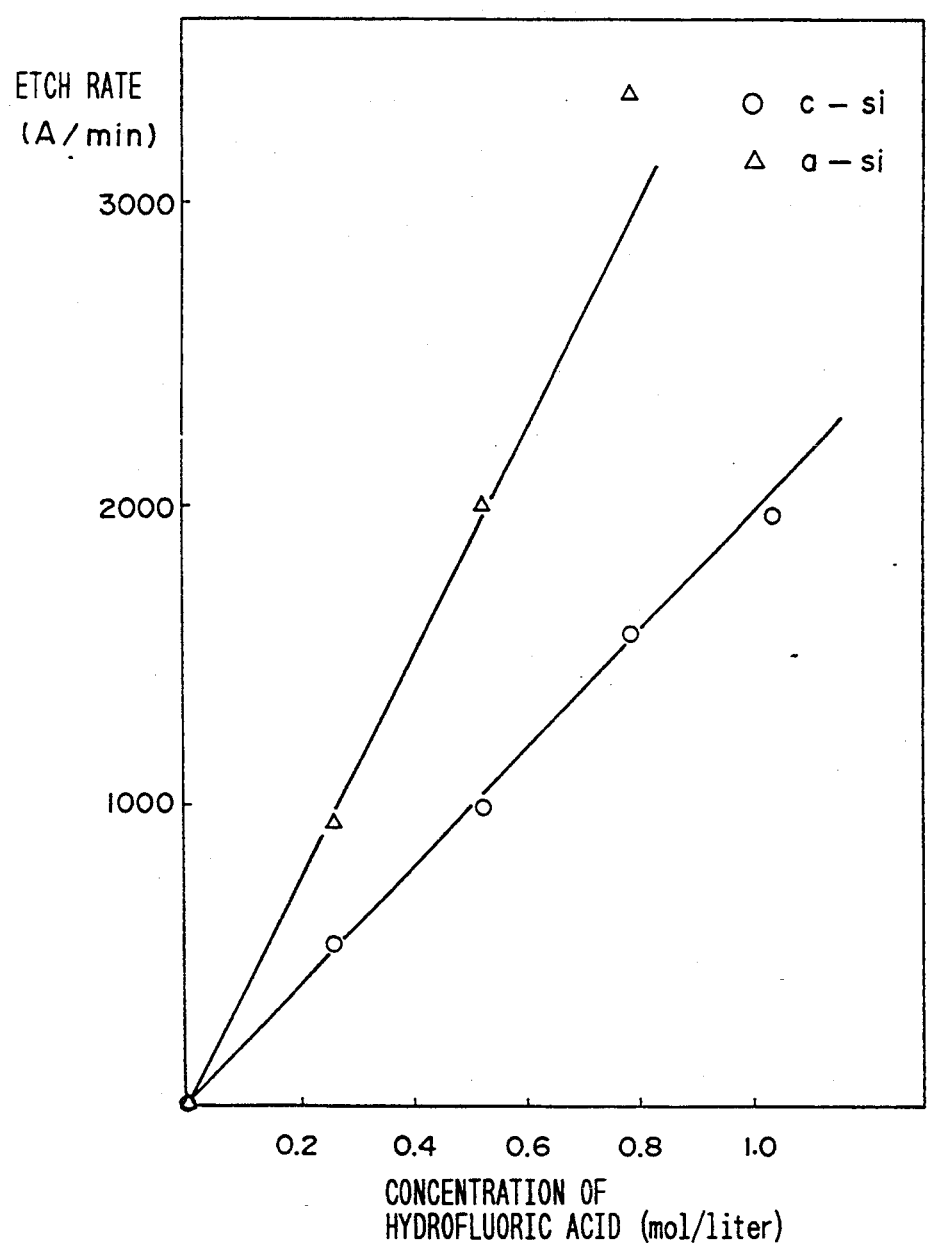
FIG. 5 is a graph showing the relationship between a concentration of hydrofluoric acid and an etch rates in Example 1.
Figure 6:
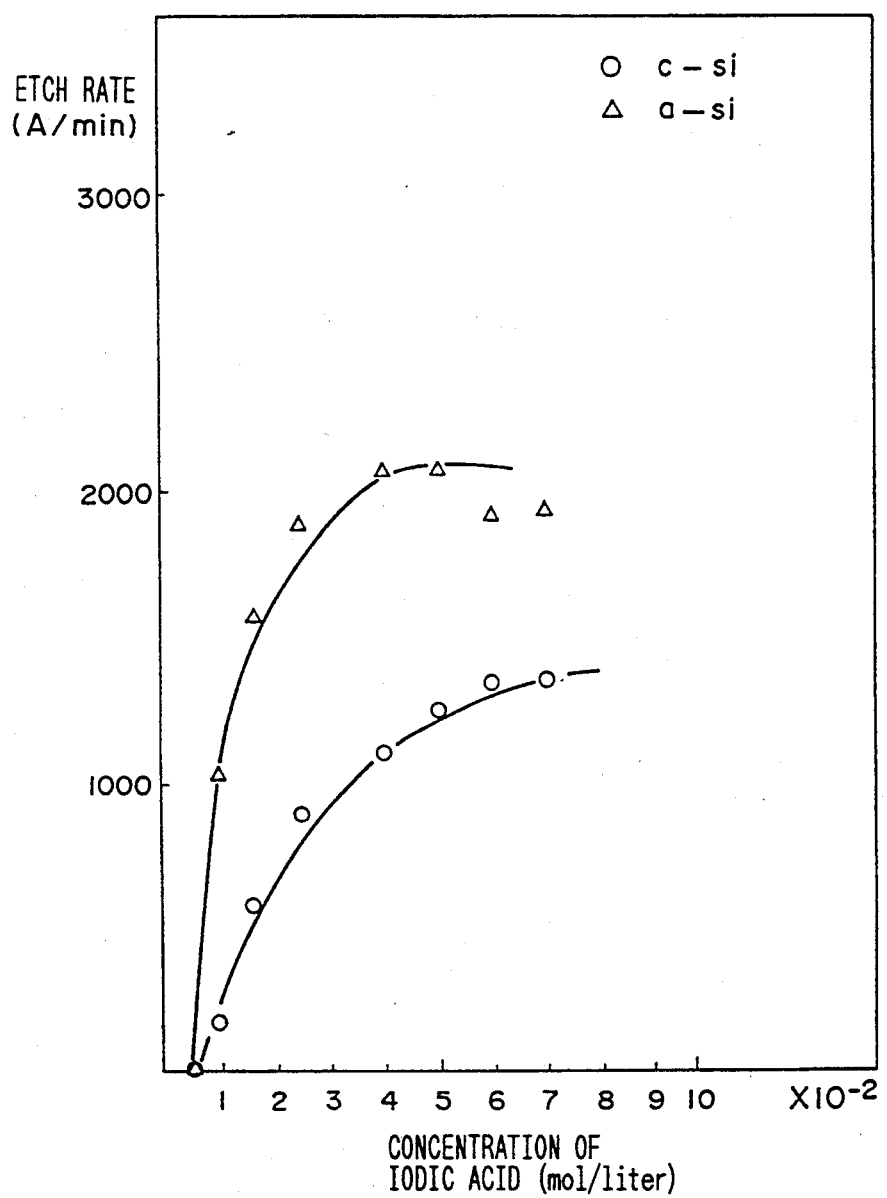
FIG. 6 is a graph showing the relationship between a concentration of iodic acid and an etch rates in Example 1.

FIGS. 5 and 6 show experimental results of measuring etch rates of c-Si (1, 0, 0) and a-Si by using the etchant of this Example 1 which had the same ingredients but was changed in a composition ratio.

In FIG. 5, marks O indicate the etch rate of c-Si and marks Δ indicate the etch rate of a-Si at room temperature both resulted when changing the concentration of hydrofluoric acid while fixing the concentration of iodic acid to 0.04 mol/l. It is seen from the results that both the etch rates are proportional to the concentration of hydrofluoric acid and the etchant having a desired etch rate can be easily obtained.

In FIG. 6, marks O indicate the etch rate of c-Si and marks Δ indicate the etch rate of a-Si at room temperature both resulted when changing the concentration of iodic acid while fixing the concentration of hydrofluoric acid to 0.52 mol/l . It is seen from the results that both the etch rates are increased with the higher concentration of iodic acid, but they are substantially constant the concentration of iodic acid over about 0.05 mol/l.

For the etchants of any composition ratios shown in FIG. 5 and 6, it was confirmed that any of the problems experienced with the conventional etchants (i.e., healing and generation of gas during the process, necessity of drain treatment to prevent an increase of the COD value, penetration of the etchants through PFA pipes, and changes of the etch rate with time) was not produced.

(EXAMPLES 2)

Experimental results of etching a-Si by using various oxoacid or oxoacid salt compounds as reagents to be added together with hydrofluoric acid are shown in Table 1.

It is seen from Table 1 that various oxoacid or oxoacid salt compounds are effective as compounds to be added to hydrofluoric acid.

TABLE 1

(A): HF concentration (mol/l) (B): oxoacid/oxoacid salt concentration (mol/l) (C): a-Si etch rate (A/min) (D): yes/no of generation of gas (E): detection of COD value (F): penetration through PFA tube (G): change of etch rate after 100 hours (%)

| No. | (A) | (B) | (C) | (D) | (E) | (F) | (G) |
|---|---|---|---|---|---|---|---|
| 1 | 0.52 | $HBrO_3$ 0.04 | 1500 | No | Non-detected | Non-detected | No change |
| 2 | 0.52 | $LiBrO_3$ 0.04 | 1200 | No | Non-detected | Non-detected | No change |
| 3 | 0.52 | $KBrO_3$ 0.04 | 1200 | No | Non-detected | Non-detected | No change |
| 4 | 0.52 | $NaBrO_3$ 0.04 | 1200 | No | Non-detected | Non-detected | No change |
| 5 | 0.78 | $NH_4BrO_3$ 0.04 | 50 | No | Non-detected | Non-detected | No change |
| 6 | 0.78 | $Ca(BrO_3)_2$ 0.04 | 100 | No | Non-detected | Non-detected | No change |
| 7 | 0.78 | $Mg(BrO_3)_2$ 0.04 | 80 | No | Non-detected | Non-detected | No change |
| 8 | 0.78 | $Zn(BrO_3)_2$ 0.04 | 50 | No | Non-detected | Non-detected | No change |
| 9 | 0.78 | $Cu(BrO_3)_2$ 0.04 | 100 | No | Non-detected | Non-detected | No change |
| 10 | 0.78 | $Al(BrO_3)_3$ 0.04 | 80 | No | Non-detected | Non-detected | No change |

TABLE 1-continued (A): HF concentration (mol/l) (B): oxoacid/oxoacid salt concentration (mol/l) (C): a-Si etch rate (A/min) (D): yes/no of generation of gas (E): detection of COD value (F): penetration through PFA tube (G): change of etch rate after 100 hours (%)

| No. | (A) | (B) | (C) | (D) | (E) | (F) | (G) |
|---|---|---|---|---|---|---|---|
| 11 | 0.52 | $HBrO_4$ 0.04 | 600 | No | Non-detected | Non-detected | No change |
| 12 | 0.78 | $LiBrO_4$ 0.04 | 80 | No | Non-detected | Non-detected | No change |
| 13 | 0.78 | $KBrO_4$ 0.04 | 80 | No | Non-detected | Non-detected | No change |
| 14 | 0.52 | $HIO_3$ 0.04 | 2000 | No | Non-detected | Non-detected | No change |
| 15 | 0.52 | $LiIO_3$ 0.04 | 1900 | No | Non-detected | Non-detected | No change |
| 16 | 0.52 | $KIO_3$ 0.04 | 1900 | No | Non-detected | Non-detected | No change |
| 17 | 0.52 | $NaIO_3$ 0.04 | 1900 | No | Non-detected | Non-detected | No change |
| 18 | 0.52 | $NH_4IO_3$ 0.04 | 400 | No | Non-detected | Non-detected | No change |
| 19 | 0.52 | $Ca(IO_3)_2$ 0.01 | 500 | No | Non-detected | Non-detected | No change |
| 20 | 1.00 | $Mg(IO_3)_2$ 0.04 | 80 | No | Non-detected | Non-detected | No change |
| 21 | 1.00 | $Al(IO_3)_2$ 0.04 | 80 | No | Non-detected | Non-detected | No change |
| 22 | 0.52 | $HIO_4, H_5IO_6$ 0.04 | 800 | No | Non-detected | Non-detected | No change |
| 23 | 0.52 | $LiIO_4$ 0.04 | 400 | No | Non-detected | Non-detected | No change |
| 24 | 0.52 | $KIO_4$ 0.04 | 400 | No | Non-detected | Non-detected | No change |
| 25 | 0.78 | $Zn_5(IO_6)_2$ 0.04 | 50 | No | Non-detected | Non-detected | No change |
| 26 | 0.78 | $KClO_3$ 0.04 | 40 | No | Non-detected | Non-detected | No change |

(EXAMPLE 3)

The etch rates resulted when etching c-Si (1, 0, 0) and a-Si by using the etchants employed in Examples 1 and 2, and the etching selective ratios of a-Si to silicon nitride (SIN) created by the plasma CVD film forming method are shown in Table 2.

TABLE 2

| No. | Etch rate (A/min) c-Si | Etch rate (A/min) a-Si | Selective ratio a-Si/SiN |
|---|---|---|---|
| 1 | 700 | 1500 | 12 |
| 2 | 600 | 1200 | 10 |
| 3 | 600 | 1200 | 10 |
| 4 | 600 | 1200 | 10 |
| 5 | trace | 50 | 2 |
| 6 | trace | 100 | 4 |
| 7 | trace | 80 | 3 |
| 8 | trace | 50 | 2 |
| 9 | trace | 100 | 3 |
| 10 | trace | 80 | 3 |
| 11 | trace | 600 | 5 |
| 12 | trace | 80 | 3 |
| 13 | trace | 80 | 3 |
| 14 | 1000 | 2000 | 16 |
| 15 | 800 | 1900 | 15 |
| 16 | 900 | 1900 | 15 |
| 17 | 800 | 1900 | 15 |
| 18 | 200 | 400 | 3 |
| 19 | trace | 500 | 4 |
| 20 | trace | 80 | 3 |
| 21 | trace | 80 | 2 |
| 22 | 400 | 800 | 6 |
| 23 | trace | 400 | 3 |
| 24 | trace | 400 | 3 |
| 25 | trace | 50 | 2 |
| 26 | trace | 40 | 2 |

As seen from Table 2, the etchants of the present invention have an ability of etching respective types of silicon, and also provide etching selective ratios for the silicon nitride as an insulator.

(EXAMPLE 4)

The etchant of Example 1 (hydrofluoric acid and iodic acid having concentrations of 0.52 mol/l and 0.04 mol/l, respectively) was prepared. A sample was prepared by forming an a-Si film on the surface of a quartz substrate by the plasma CVD method and then forming a fine pattern comprising lines and spaces of 5 μm thereon by using a photoresist (OFPR made by Tokyo Applied Chemical Co., Ltd.). This sample was dipped in the etchant for producing an etched pattern in the a-Si.

Figure 7:
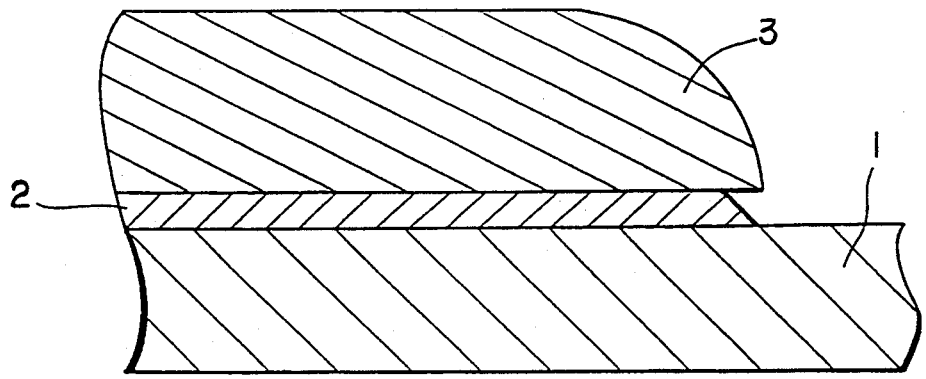
FIG. 7 is a schematic cross-sectional view showing an etched state in Example 1.

The result of the pattern etching is shown in FIG. 7. It is confirmed from FIG. 7 that there occurred no side etching due to deterioration in adhesion of the photoresist 3 against the a-Si.

It was also found that the present etchant developed no action of dissolving the photoresist 3. This means in combination with the results of above Example 3 that the present etchant is highly effective in manufacturing thin film transistors in which silicon nitride is used as a gate insulating film and a-Si is used as a semiconductor layer.

(EXAMPLE 5)

A detergent was prepared adding hydrofluoric acid (EL grade made by Daikin Kogyo Co., Ltd.) and iodic acid ($HIO_3$) (special grade made by Wako Junyaku Co., Ltd.) to pure water in a Teflon container such that the hydrofluoric acid and the iodic acid had concentrations of 1.0 mol/l and 0.15 mol/l, respectively. A plate member made of stainless steel (SUS 306) and having the surface ground into a mirror surface was dipped in the detergent for cleaning of the steel surface. In order to evaluate the cleanness of the plate member surface, a surface contact angle of pure water was measured (by using a contact angle gauge made by Kyowa Interface Science Co., Ltd.). As a result, the surface contact angle was 10° after the cleaning, while it was 30° before the cleaning. It was thus confirmed that the surface cleanness was apparently improved by using the present detergent.

It was also confirmed that any of the problems experienced with the conventional detergents (i.e., heating and generation of gas during the process, necessity of drain treatment to prevent an increase of the COD value, penetration of the detergents through PFA pipes, and changes of the cleaning rate with time) was not produced during the cleaning process.

A chamber of a vacuum apparatus was manufactured by assembling the above plate member and other members similarly cleaned. A vacuum degree achieved by the manufactured vacuum apparatus was $2 \times 10^{-7}$ Torr. This evacuation capability is comparable to that of a vacuum apparatus manufactured by assembling those members which are cleaned by using the conventional detergents. It is thus seen that the process of cleaning members of such an apparatus by using the present detergent is effective as a method of manufacturing the apparatus.

(EXAMPLE 6)

A detergent having the same composition as the etchant of Example 1 (hydrofluoric acid and iodic acid having concentrations of 0.52 mol/l and 0.04 mol/l, respectively) was prepared. A plate member made of glass (#7059 by Coning Co.) and having the ground surface was dipped in the detergent for cleaning of the glass surface. In order to evaluate the cleanness of the plate member surface, a surface contact angle of pure water was measured similarly to above Example 5. As a result, the surface contact angle was 10° after the cleaning, while it was 30° 3before the cleaning. It was thus confirmed that the surface cleanness was apparently improved and the cleaning method by using the present detergent was effective.

(EXAMPLE 7)

A detergent having the same composition as the detergent of Example 6 (hydrofluoric acid and iodic acid having concentrations of 0.52 mol/1 and 0.04 mol/1, respectively) was prepared. An appliance made of quartz was dipped in the detergent for cleaning of the quartz surface. In order to evaluate the cleanness of the appliance surface, a surface contact angle of pure water was measured similarly to above Example 5. As a result, the surface contact angle was 7° after the cleaning, while it was 30° before the cleaning. It was thus confirmed that the surface cleanness was apparently improved and the appliance cleaning method by using the present detergent was effective.

As described above, since the etchant and the detergent according to the present invention contains, in a solution, hydrofluoric acid and an oxoacid or oxoacid salt compound expressed by $Mm(XOn)p$ (where M is hydrogen, one-to three-valence metal or $NH_4$, m is 1 or 5, X is a halogen element, n is 3, 4 or 6, and p is 1, 2 or 3), the oxoacid or oxoacid salt compound serves as a strong oxidizer to change the solid surface or a contaminant formed on the solid surface into an oxide. The oxide is then dissolved by the hydrofluoric acid. Therefore, the present etchant or detergent acts effectively in a process of etching desired portions of constituent members of a device/apparatus or in a process of cleaning the member surfaces to remove contaminants formed thereon.

During the process, there generates no toxic gas as a secondary product, with the result that any special apparatus for treating such a toxic gas is not required.

Since the oxoacid or oxoacid salt compound does not sublimate, the present detergent and detergent are stable for a long period of time and hence very easy in operating control.

Also, since the present etchant and detergent have no property to penetrate ordinary tubes made of perfluoroalkoxy fluoride-contained polymers (PFA), the necessity of using special pipings is eliminated and management of a production factory is much facilitated.

Furthermore, since the present etchant and detergent contain no organic solvents, a COD value of the drain will not be increased, meaning no necessity of special equipment for treating the waste water.

The present etchant can be sufficiently applied to a process of forming fine patterns on constituent members of a device, such as semiconductor members, for the reasons that no gas is generated during the process, and adhesion between a photoresist and the member to be etched is not deteriorated to substantially prevent the occurrence of side etching.

Because of no heating during the etching and cleaning process, temperature control of the surface to be processed can be accurately and easily performed. This feature not only enables the present etchant to be sufficiently employed in forming fine patterns through the etching process, but also ensures a sufficient degree of safety and eliminates the need of installing special equipment for security against disasters in the processes of using the present etchant or detergent to etch the surfaces of constituent members of an electronic device or the like during manufacture thereof, to clean the surfaces of constituent members of an apparatus, such as plate members and stainless pipes, during manufacture of the apparatus, and to clean appliances for use with the above process, Additionally, in the manufacture process of semiconductor devices which are representative of electronic devices, since the present etchant contains no organic ingredients as mentioned above, the photoresist is never be damaged by the present etchant. Therefore, photoresist dissolved portions are not produced to prevent the photoresist from being changed into a porous film, with the result that the present etchant is also applicable to forming of fine patterns.

What is claimed is:

1. A method for etching a silicon semiconductor material, said silicon semiconductor material being one of a single crystal silicon, a polycrystalline silicon and an amorphous silicon, the method comprising the step of etching said silicon semiconductor material using an etchant containing, in a solution, hydrofluoric acid and an iodic acid or iodic acid salt compound expressed by $MIO_3$ (where M is hydrogen, Li, K or Na).

2. A method for cleaning a silicon semiconductor material, said silicon semiconductor material being one of a single crystal silicon, a polycrystalline silicon and an amorphous silicon, the method comprising the step of cleaning said silicon semiconductor material using a detergent containing, in a solution, hydrofluoric acid and an iodic acid or iodic acid salt compound expressed by $MIO_3$ (where M is hydrogen, Li, K or Na).

3. An etchant for etching a silicon semiconductor material, said silicon semiconductor material being one of a single crystal silicon, a polycrystalline silicon and an amorphous silicon, the etchant comprising, in a solution, hydrofluoric acid and an iodic acid or iodic acid salt compound expressed by $MIO_3$ (where M is hydrogen, Li, K or Na).

4. A detergent for cleaning a silicon semiconductor material, said silicon semiconductor material being one of a single crystal silicon, a polycrystalline silicon and an amorphous silicon, the detergent comprising, in a solution, hydrofluoric acid and an iodic acid or iodic acid salt compound expressed by $MIO_3$ (where M is hydrogen, Li, K or Na).

* * * * *